United States Patent
Hsieh et al.

(10) Patent No.: US 7,196,012 B2
(45) Date of Patent: Mar. 27, 2007

(54) METHODS FOR PLANARIZATION OF DIELECTRIC LAYER AROUND METAL PATTERNS FOR OPTICAL EFFICIENCY ENHANCEMENT

(75) Inventors: Yeou-Lang Hsieh, Taipei (TW); Chin-Min Lin, Taiping (TW); Jiann-Jong Wang, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/084,228

(22) Filed: Mar. 16, 2005

(65) Prior Publication Data

US 2005/0227490 A1    Oct. 13, 2005

Related U.S. Application Data

(60) Provisional application No. 60/562,086, filed on Apr. 13, 2004.

(51) Int. Cl.
*H01L 21/461* (2006.01)
*H01L 21/302* (2006.01)

(52) U.S. Cl. .................................. 438/693; 257/E21.23
(58) Field of Classification Search ................ 438/622, 438/618, 624, 693, 691, 551; 257/E21.23
See application file for complete search history.

(56) References Cited

U.S. PATENT DOCUMENTS

| | | | | |
|---|---|---|---|---|
| 5,795,495 A | * | 8/1998 | Meikle | 216/88 |
| 5,889,277 A | * | 3/1999 | Hawkins et al. | 250/208.1 |
| 5,928,959 A | * | 7/1999 | Huckels et al. | 438/691 |
| 6,153,933 A | * | 11/2000 | Chan et al. | 257/752 |
| 6,207,533 B1 | * | 3/2001 | Gao | 438/424 |
| 6,362,092 B1 | * | 3/2002 | Shieh et al. | 438/631 |
| 6,777,320 B1 | * | 8/2004 | Chiang et al. | 438/618 |
| 6,867,116 B1 | * | 3/2005 | Chung | 438/551 |
| 2001/0013506 A1 | * | 8/2001 | Chamberlin et al. | 216/88 |

* cited by examiner

*Primary Examiner*—Asok Kumar Sarkar
(74) *Attorney, Agent, or Firm*—Kirkpartick & Lockhart Preston Gates Ellis LLP

(57) ABSTRACT

A method and system for improving planarization and uniformity of dielectric layers for providing improved optical efficiency in CCD and CMOS image sensor devices. In various embodiments, a dielectric planarization method for achieving better optical efficiency includes first depositing a first dielectric having an optically transparent property on and around a metal pattern. Optical sensors are formed in or on the substrate in areas between metal features. The metal pattern protects a sensor situated therebetween and thereunder from electromagnetic radiation. After the first dielectric layer is polished using CMP, a slanted or inclined surface is produced but this non-uniformity is eliminated using further planarization processes that produce a uniform total dielectric thickness for the proper functioning of the sensor.

20 Claims, 5 Drawing Sheets

METHODS FOR PLANARIZATION OF DIELECTRIC LAYER AROUND METAL PATTERNS FOR OPTICAL EFFICIENCY ENHANCEMENT

RELATED APPLICATION

This application is related to and claims priority of provisional U.S. Patent Application Ser. No. 60/562,086, filed Apr. 13, 2004 entitled "METHOD FOR PLANARIZATION OF DIELECTRIC LAYER BETWEEN TWO METAL PATTERNS."

BACKGROUND

The present invention relates generally to semiconductor processing, and more particularly to structures and methods for planarization of dielectric layers around metal patterns for optical efficiency enhancement.

The development and deployment of optical devices such as CMOS image sensor and charge-coupled devices (CCD) have been growing rapidly in recent years. These devices have many special requirement compared to general logic device. For example, one of the requirements is the reduction of thickness of optical transparent dielectric in a back-end passivation layer such as silicon oxide, silicon nitride or silicon oxynitride. Another requirement is the uniform thickness of the optically transparent dielectric material in the regions between metal patterns, as well as the uniform thickness of the dielectric material over the patterned metal. The metal pattern is used to block electromagnetic radiation, especially light, in the optical wavelength range. The incident light will pass through locations between metal patterns to an optical sensing unit formed in or on the substrate. The non-uniform thickness of optical transparent dielectric in the areas between metal patterns will change the refractive index which results in discolor phenomenon.

Due to the loading effect of chemical mechanical polishing (CMP), the dielectric between adjacent metal patterns may not be planar; rather, the dielectric may include a slanted or inclined surface. The slanted or incline surface of dielectric is indicative of thickness non-uniformity, which not only causes visual discolor but also degrades a sensor's performance.

Therefore, desirable in the art of semiconductor processing are methods to improve planarization of dielectric layers for better optical efficiency.

SUMMARY

In view of the foregoing, the following provides methods for improving planarization of dielectric layers for better optical efficiency.

In various embodiments, various dielectric planarization methods for achieving better optical efficiency are provided. For example, a first dielectric layer having at least an optically transparent property is deposited on and around a metal pattern comprising one or more deposited metals. The metal of the metal pattern protects sensors situated therebetween and thereunder, from electromagnetic radiation. After the first dielectric layer is polished using chemical mechanical polishing (CMP), the resulting surface may be slanted or inclined, i.e. non-planar, and not parallel to the substrate. The slanted surface is removed from the first dielectric layer and a uniform and planarized dielectric surface for the proper functioning of the sensor, is formed.

According to one embodiment, a mask with the reverse of the metal pattern is utilized to planarize the dielectric. Photo processes and oxide etching processes are used to etch the dielectric and are followed by a CMP process to yield a planarized dielectric layer.

The construction and method of operation of the invention, however, together with additional objects and advantages thereof will be best understood from the following description of specific embodiments when read in connection with the accompanying drawings.

DESCRIPTION

The following detailed description provides methods for planarization of dielectric layers on and around metal patterns for enhancing optical efficiency.

Figure 1A:
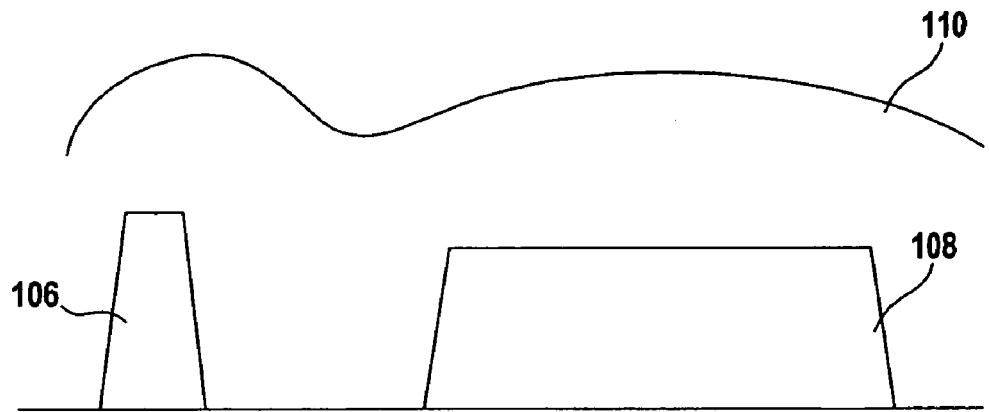
FIGS. 1A and 1B illustrate a conventional flow for treating dielectric layers on and between metal patterns.
Figure 1B:
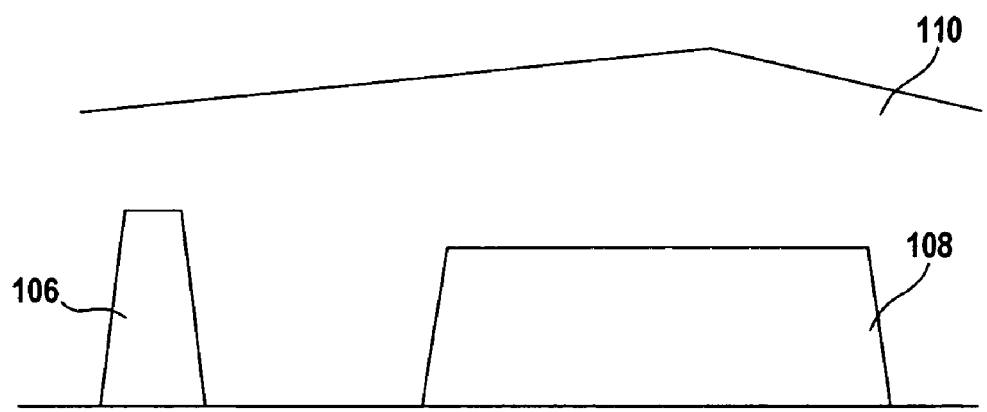

FIGS. 1A and 1B illustrate a conventional flow for treating dielectric layers on and between metal patterns. The conventional flow includes two steps shown in the two figures. Metals 106 and 108 within both the steps are implemented to block electromagnetic radiation, especially light, in the optical wavelength range. The metals 106 and 108 may be formed from the same metal film or from different metal. Metals 106 and 108 may include different dimensions, and depending on the underlying topography and whether metals 106 and 108 are formed from the same or a different film, it is understood that the heights of metals 106 and 108 may be slightly different. The two steps shown in FIGS. 1A and 1B illustrate how this difference in height can create problems for sensor's performance.

Referring to FIG. 1A, a first dielectric layer 110 is deposited on and between the metals 106 and 108. First dielectric layer 110 is optically transparent. The height of the surface of the first dielectric layer 110 will vary throughout the entire surface due to its conformality and the gap between the metals 106 and 108 and the height will also vary due to the dimensional differences (vertical and horizontal) of the metals 106 and 108. The first dielectric layer 110 then undergoes chemical mechanical polishing (CMP) in the step as shown in FIG. 1B. Due to the loading effect of CMP and the non-uniformity height of the first dielectric layer 110, the polishing process will result in the dielectric material between and over the metals 106 and 108 having a slanted or inclined surface which is not uniformly parallel to the substrate over which it is formed and may be non-planar. The slanted or inclined surface of dielectric is indicative of thickness non-uniformity, which not only causes visual discoloration but also degrades sensors performance since it results in a different distance between features such as lenses formed over the dielectric, and the sensing units formed in or on the substrate and below the dielectric.

FIGS. 2A through 2D illustrate a flow for treating dielectric layers in accordance with the first embodiment of the present invention. This flow shows a method for uniform planarization of a dielectric surface, and is broken down into four steps for illustrative purposes, in one exemplary embodiment.

Figure 2A:
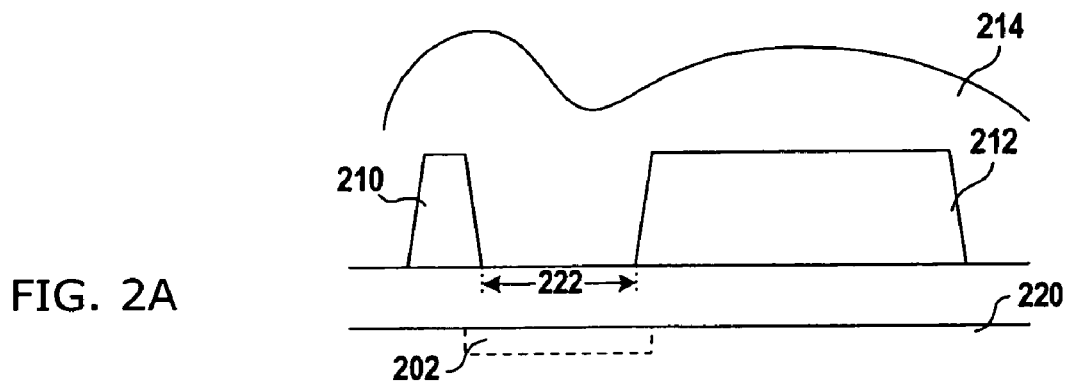
FIGS. 2A through 2D illustrate a flow for treating dielectric layers in accordance with the first exemplary embodiment of the present invention.

Referring to FIG. 2A, metals 210 and 212 are implemented to block electromagnetic radiation, especially light, in the optical wavelength range. The metals 210 and 212, are metal features and, collectively, are considered a metal pattern. The pattern may be formed by plasma etching, in one embodiment. The metals 210 and 212 can be lines, islands, or pads that are made of metal such as copper, aluminum, various metal compounds, or metal alloys. The metals 210 and 212 may be formed from the same metal film or from different metal films. Metals 210 and 212 may be different in dimension size, and depending on the underlying topography and whether metals 210 and 212 are formed from the same or a different film, the heights of metals 212 and 210 may be different. Sensing units 202 may be formed in or on the substrate 220 in region 222 that lies between the metals 210 and 212. The sensing units 202 may be used to form optical sensors such as a CCD, or a 3-transistor or 4-transistor pinned photodiode CMOS image sensor. For example, a 4-transistor pinned photodiode pixel sensor may be formed on semiconductor substrate 220.

Figure 2B:
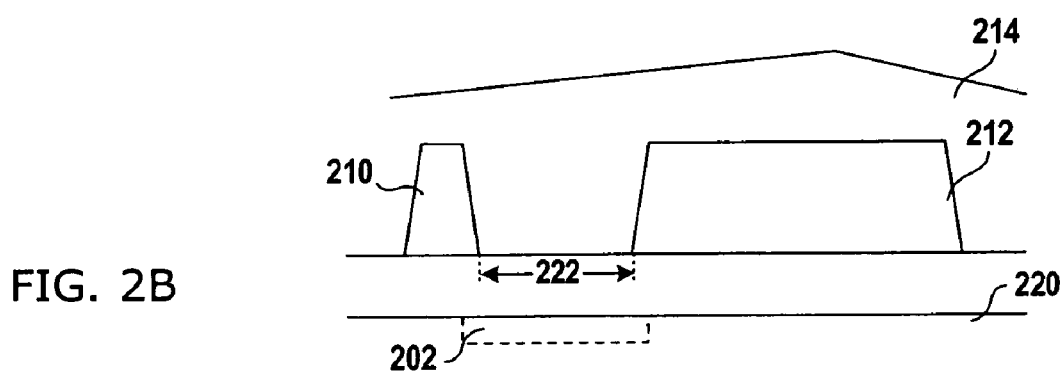

A first dielectric layer 214 is deposited after the formation of the metals 210 and 212 through plasma deposition or chemical vapor deposition. The first dielectric layer 214 could be formed by plasma enhanced chemical vapor deposition (PECVD) or high density plasma chemical vapor deposition (HDPCVD) or a combination thereof. The first dielectric layer 214 may be a silicon oxide or another suitable dielectric material and is generally a substantially optical transparent material. The first dielectric layer 214 may be one or more films and may include a total thickness ranging from 10000 Å to 25000 Å and in one embodiment may be two films with a combined thickness of about 18000 Å. The height of the surface of the first dielectric layer 214 will vary throughout due to the conformality of the film(s), and the gap between the metals 210 and 211 and also due to the dimensional differences of the metals 210 and 212. A CMP process is then performed on the first dielectric layer 214 as shown in FIG. 2B. Due to the loading effect of CMP and the non-uniform height of the first dielectric layer 214, the polished dielectric material between the metals 210 and 212 will suffer a slanted or inclined surface which is not uniformly parallel to the substrate 220 over which it is formed and may be non-planar and uneven. The slanted or inclined surface of dielectric is indicative of thickness non-uniformity, which, in image sensor devices, not only causes visual discoloration but also degrades sensors and adversely affects optical performance. The thickness of dielectric layer 214 that remains over the first metal 210 and/or second metal 212 may vary and may be about 4000 A in one exemplary embodiment.

Figure 2C:
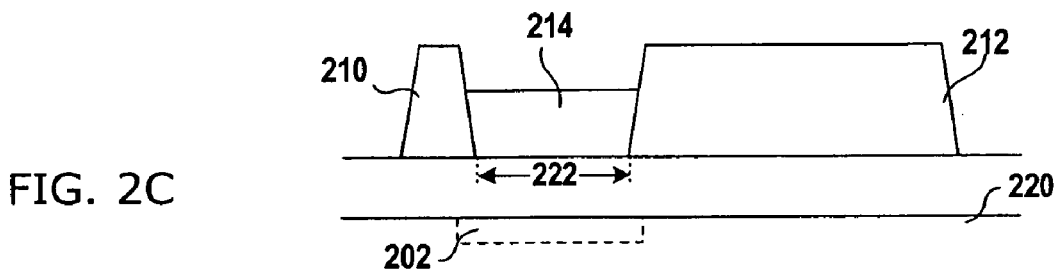

Referring to FIG. 2C, the first dielectric layer 214 is etched all the way down to the metals 210 and 212 using a selective etch process. Due to this etching process, the upper surface of the remaining first dielectric layer 214 is lower than the upper surfaces of the metals 210 and 212. The thickness of the remaining dielectric between the metal features may be about 50% or more of the thickness of one or both of the metals 210 and 212. The slanted surface of the first dielectric layer 214 is eliminated by the end of this step.

Figure 2D:
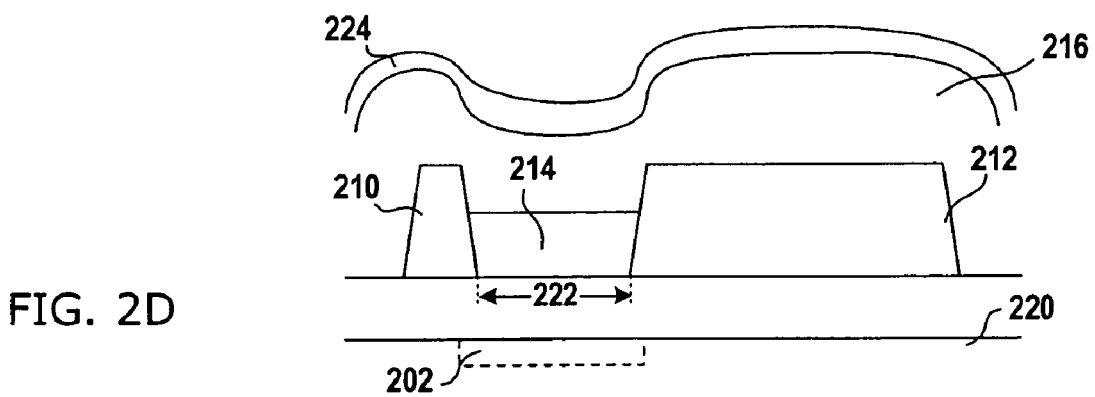

Referring to FIG. 2D, a second dielectric layer 216, which is substantially an optical transparent material made by CVD or Spin-On method, is next deposited as a passivation layer above the first dielectric layer 214 and the metals 210 and 212. Various thicknesses may be used. Throughout the substrate 220, the total thickness of the dielectric materials over the metal areas is substantially the same and the total thickness of the dielectric material in areas between the metal areas i.e., over the optical sensors 202, is substantially the same. A layer 224 of color filters, microlenses or associated features are then formed over the optical sensors 202 formed in the substrate 220 to form CMOS image sensors and CCD devices. With improved uniformity of the dielectric layers, any visual discoloration is improved or eliminated, thereby allowing sensors and other devices to function properly.

Figure 3A:
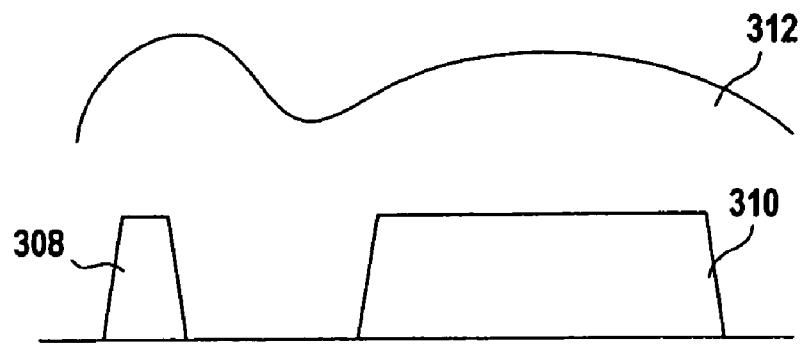
FIGS. 3A through 3C illustrate a flow for treating dielectric layers in accordance with the second exemplary embodiment of the present invention.
Figure 3B:
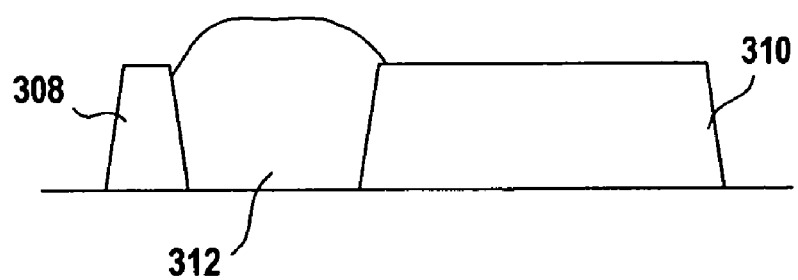
Figure 3C:
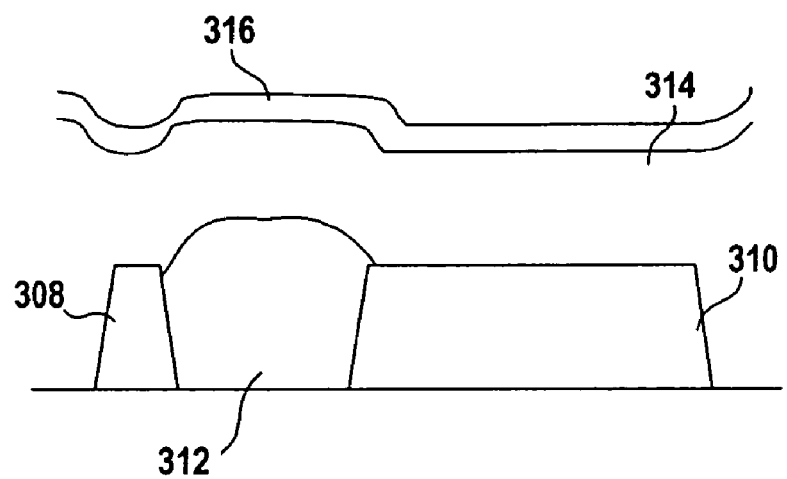

FIGS. 3A through 3C illustrate a flow for treating dielectric layers in accordance with the second embodiment of the present invention. The flow shows another method used for uniform planarization of dielectric surface where both a first dielectric layer and metals are treated with CMP before depositing a second dielectric layer.

Referring to FIG. 3A, metals 308 and 310 are implemented to block electromagnetic radiation, especially light, in the optical wavelength range. The metals 308 and 310 are metal features and may be formed from the same metal film or from different metal films. Metals 308 and 310 may be different in dimension size, and depending on the underlying topography and whether metals 308 and 310 are formed from the same or a different film, the heights of metals 310 and 308 may be different. A first dielectric layer 312 is deposited after the metals 308 and 310 are formed by plasma etching. First dielectric layer 312 is as described in conjunction with first dielectric layer 214 and may by be multiple layers. Referring to FIG. 3B, CMP is then performed on the first dielectric layer 312 resulting in the uneven, slanted surface (not shown) also described in conjunction with FIG. 2B and shown in FIG. 1B. A further CMP operation is also performed on the metals 308 and 310, using a process in which the polishing rate of metal is greater than that of the first dielectric layer 312. This results in the upper surface of the remaining first dielectric layer 312 in the space between the metals 308 and 310 being higher than that of either of the metals 308 and 310. The slanted or inclined surface that was produced in the first dielectric layer 312 by the initial CMP, is eliminated by the end of this step.

Referring to FIG. 3C, a second dielectric layer 314, which is substantially an optically transparent material formed by CVD or Spin-On method, is deposited as a passivation layer. Various thicknesses may be used. Throughout the substrate, the thickness of the dielectric material over the metal areas is substantially the same and the total thickness of the dielectric material in areas between the metal areas i.e., over the optical sensors, is substantially the same. The second dielectric layer 314 may be one or more films and may include a total thickness ranging from 1000 Å to 10000 Å and may be 4000 A in one embodiment. A layer 316 of color filters, microlenses or associated features are then formed over the optical sensors formed in the substrate to form CMOS image sensors and CCD devices. With improved planarization and uniformity of the dielectric layers, any visual discoloration is improved or eliminated, thereby allowing sensors and other devices to function properly.

Figure 4A:
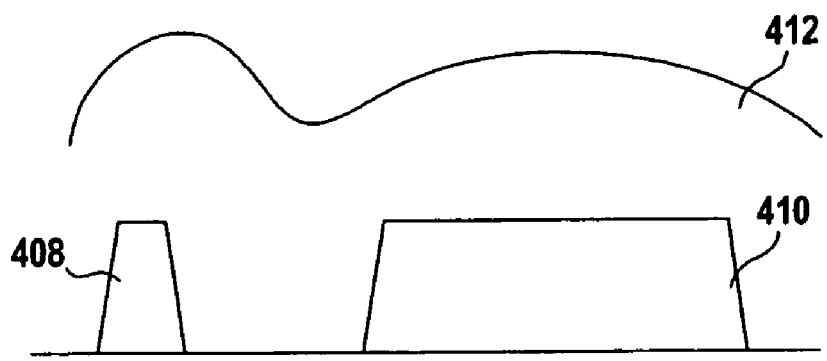
FIGS. 4A through 4C illustrate a flow for treating dielectric layers in accordance with the third exemplary embodiment of the present invention.
Figure 4B:
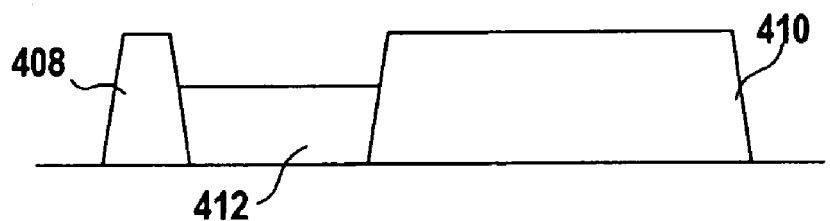
Figure 4C:
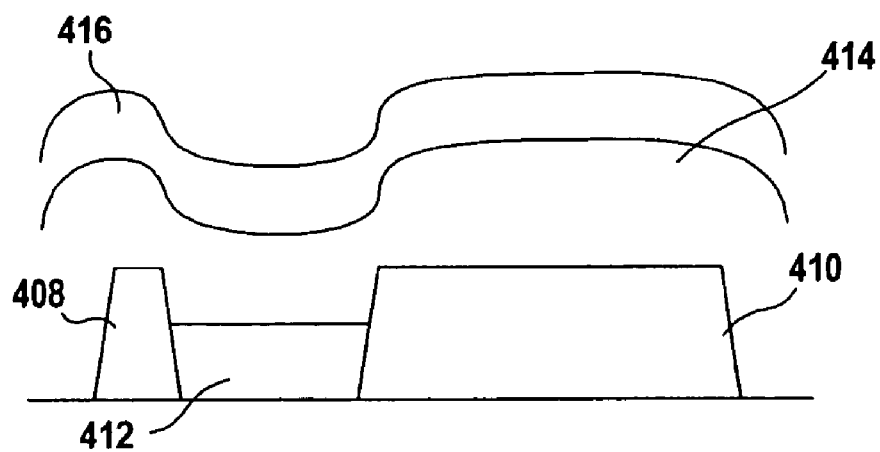

FIGS. 4A through 4C illustrate a flow for treating dielectric layers in accordance with a third embodiment of the present invention. The flow provides yet another method for uniform planarization of the dielectric surface in the illustrated embodiment.

Referring to FIG. 4A, metals 408 and 410 are implemented to block electromagnetic radiation, especially light, in the optical wavelength range. The metals 408 and 410, are metal features and collectively form a metal pattern, and they may be lines, islands, or pads that are made of metal such as copper, aluminum, various metal compounds, or metal alloys. The metals 408 and 410 may be formed from the same metal film or from different metal films. Metals 408 and 410 may include different dimensions, and depending on the underlying topography and whether metals 408 and 410 are formed from the same or a different film, the heights of metals 410 and 408 may differ to a degree. A first dielectric 412, like first dielectric layer 214 in FIG. 2A, is deposited after the metals 408 and 410 are formed. Referring to FIG. 4B, a CMP operation that polishes the dielectric layer 412 at a rate faster than it polishes metals, is then performed on the first dielectric layer 412 and recesses the first dielectric 412 below the metals 408 and 410. As a result, the upper surface of the remaining first dielectric layer 412 is substantially lower than the upper surfaces of the metals 408 and 410. The slant surface of the first dielectric layer 412 is improved or eliminated by the end of this step. Referring to FIG. 4C, a second dielectric layer 414, which is substantially an optically transparent material made by CVD or Spin-On method, is next deposited as a passivation layer above the first dielectric layer 412 and the metals 408 and 410. Various thicknesses may be used. Throughout the substrate, the thickness of the dielectric material over the metal areas is substantially the same and the total thickness of the dielectric material in areas between the metal areas i.e., over the optical sensors, is substantially the same. A layer 416 of color filters, microlenses and associated features are then formed over the optical sensors formed in the substrate to form CMOS image sensors and CCD devices. With improved planarization and uniformity of the dielectric layers, any visual discoloration is improved or eliminated, thereby allowing sensors and other devices to function properly.

While the first, the second, and the third embodiments are illustrated with only two dielectric layers, it is understood that this invention is not limited to two layers. For example, an alternative method and embodiment is to form a third dielectric layer, a substantially optical transparent layer, by a spin-on method or a CVD method to reduce the device color filter ultra violet light (CF/UL) stack while improving optical sensitivity and reducing refraction.

It is further noted that the second dielectric layers deposited in the described embodiments all serve as a passivation layer and may include a thickness of 50 nm to 2000 nm to protect the underlying optical sensor from moisture and contamination. For example, if the second dielectric layer is a stack of silicon oxide and silicon nitride, the thickness of silicon oxide is advantageously from 200 nm to 600 nm while the thickness of silicon nitride is advantageously from 100 nm to 300 nm. If the second dielectric layer is a single silicon nitride layer, the thickness may range from 50 nm to 600 nm. If the second dielectric layer is single silicon oxide layer, the thickness is advantageously from 50 nm to 600 nm.

Figure 5A:
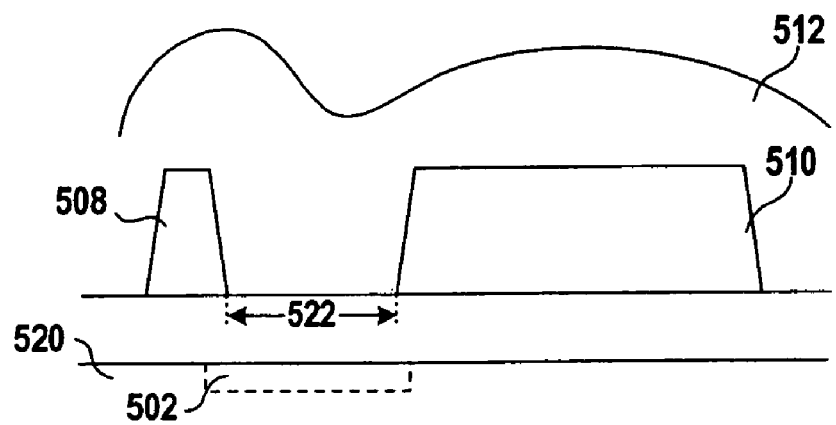
FIGS. 5A through 5C illustrate a flow for treating dielectric layers in accordance with the fourth exemplary embodiment of the present invention.
Figure 5B:
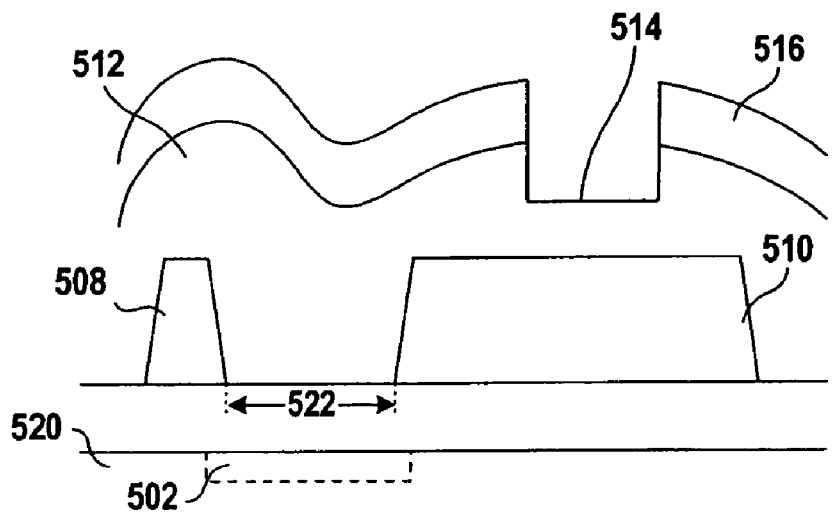
Figure 5C:
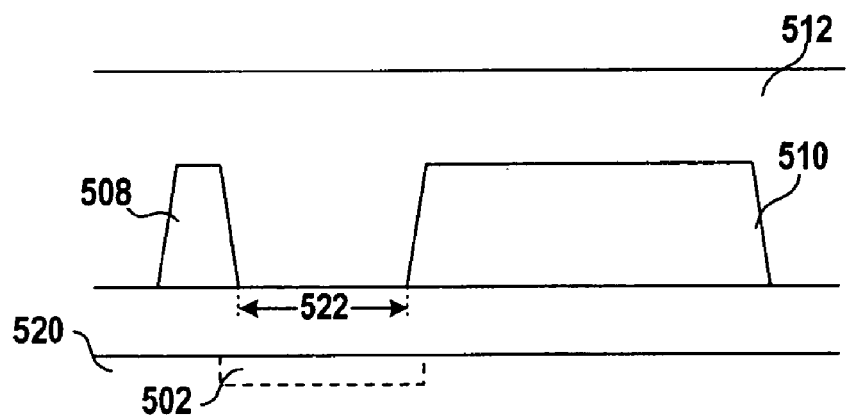

FIGS. 5A through 5C illustrate a flow for treating dielectric layers in accordance with the fourth embodiment of the present invention. The flow presents yet another method for uniform planarization of the dielectric surface by using an additional mask.

Referring to FIG. 5A, metals 508 and 510 are present to block electromagnetic radiation, especially light, in the optical wavelength range. The metals 508 and 510 are metal features and collectively form a metal pattern, and may be lines, islands, or pads that are made of metal such as copper, aluminum, various metal compounds, or metal alloy. The metal pattern may be formed by plasma etching in one embodiment. The metals 508 and 510 may be formed from the same metal film or from different metal films. Metals 508 and 510 may include different dimensions, and depending on the underlying topography and whether metals 508 and 510 are formed from the same or a different film, the heights of metals 510 and 508 may be different. Sensing units 502 may be formed in or on the substrate 520 in regions 522 between metals 508 and 510. A first dielectric layer 512 which may be one or more dielectric films as described previously, is also deposited after the formation of the metals 508 and 510. Referring to FIG. 5B, a photomask 516 is next used along with a photolithography process and an oxide etching process to produce recess 514 over one or more metals such as metal 510 and make the first dielectric layer 512 more uniform. In one exemplary embodiment, the photomask 516 may include the reverse tone of the metal pattern and produce a photo pattern that includes void areas over the metal with photoresist in other areas. Referring to FIG. 5C, after the photomask is removed, CMP is then performed on the first dielectric layer 512 to complete the process. After CMP, the total thickness of the dielectric material over the metal areas is substantially the same and the total thickness of the dielectric material in areas between the metal areas i.e., over the optical sensors, is substantially the same. Improved planarization and uniformity of the dielectric layer is achieved and the slanted or inclined surface avoided.

The various exemplary embodiments may include the following. The metals 508 and 510 may be covered by 8K to 14K of one or more an oxide films deposited over the metals 508 and 510 as the first dielectric layer 512. In one exemplary embodiment, around 8K of the oxide film from the first dielectric layer 512 is removed from over the top of the metal 510 to even the heights of the first dielectric layer 512 above the metals 508 and 510. This leaves around 6K of oxide film above the metal 510 as shown in FIG. 5B. CMP is then performed on the entire first dielectric layer 512 for a thickness of 2K as shown in FIG. 5C. Improved planarization of dielectric is achieved, since the produced surface will not be slanted or declined.

This invention provides various methods for eliminating thickness non-uniformity in the dielectric layers. By etching back the first dielectric layer or treating it with CMP until the uneven or slanted of the first dielectric layer is eliminated, the second dielectric layer may be deposited on the first dielectric layer and the metals to achieve improved planarization of surface. With such methods, the produced dielectric surface will be uniform and not slanted or inclined, thereby allowing the devices or sensors to function properly and without visual discoloration. The device CF/UL stack can also be reduced with these methods, thereby improving optical sensitivity as well as reducing refraction.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a semiconductor device comprising:
   providing a metal pattern including metal features, over a substrate;
   depositing at least one first dielectric layer of optical transparency over the metal features and the substrate between the metal features;
   polishing the at least one first dielectric layer; and
   removing the at least one first dielectric layer until any inclined surface thereof in relation to the substrate is eliminated.

2. The method as in claim 1, further comprising providing optical sensors in or on the substrate in the areas between the metal features and forming a color filter and at least one microlens over at least one of the optical sensors.

3. The method as in claim 1, wherein the polishing the at least one first dielectric layer comprises using a chemical mechanical polishing operation that polishes the at least one first dielectric layer at a faster rate than the metal features to form a top surface of the at least one first dielectric layer below top surfaces of the metal features.

4. The method as in claim 1, further comprising, after the polishing, selectively etching the at least one first dielectric layer to make a top surface of the at least one first dielectric layer below top surfaces of the metal features.

5. The method as in claim 4, wherein the polishing does not expose the top surfaces of the metal features.

6. The method as in claim 4, wherein the polishing produces different dielectric thicknesses over the metal features and the substrate in areas between the metal features.

7. The method as in claim 5, wherein about 1000–10000 angstroms of the at least one first dielectric remains over the top surfaces of the metal features alter the polishing.

8. The method as in claim 1, comprising further polishing the metal features at a polish rate faster than that of the at least one first dielectric layer to form top surfaces of the metal features below a top surface of the at least one first dielectric layer.

9. The method as in claim 1, further comprising, after the depositing and prior to the polishing, etching portions of the at least one first dielectric layer disposed over the metal features.

10. The method as in claim 9, wherein the etching comprises forming a photoresist pattern over the at least one first dielectric layer, the photoresist pattern including a void area aligned ova the metal feature.

11. The method as in claim 10, wherein a reverse tone mask of the metal pattern is used in forming the photoresist pattern.

12. The method as in claim 1, wherein the metal features include upper surfaces of different heights.

13. The method as in claim 1, wherein the polishing produces different dielectric thicknesses over the metal features and the substrate in areas therebetween.

14. The method as in claim 1, wherein the metal features are formed by separate metal layers.

15. The method as in claim 1, wherein the at least one first dielectric layer is deposited by using plasma enhanced chemical vapor deposition (PECVD) or high density plasma chemical vapor deposition (HDPCVD).

16. The method as in claim 1, wherein the at least one first dielectric layer includes a thickness of about 10000–25000 angstroms, the polishing leaves about 1000–10000 angstroms of the at least one first dielectric layer over the metal features, and the second dielectric comprises a thickness of about 1000–10000 angstroms.

17. A method for forming a semiconductor image sensor comprising:
   providing a metal pattern with metal features over a substrate and optical sensors in or on the substrate in areas between the metal features;
   depositing at least one optically transparent dielectric layer over the metal features and the substrate in the areas between the metal features;
   polishing the at least one dielectric layer using chemical mechanical polishing;
   etching the at least one dielectric layer remaining over the metal features until any inclined surface that is not parallel to the substrate is eliminated; and
   forming at least one of a color filter and a microlens over at least one of the optical sensors.

18. The method as in claim 17, wherein the polishing produces substantially the same thickness of the at least one dielectric layer over the metal features and substantially the same second thickness of the at least one dielectric layer over the substrate in the areas between the metal features.

19. The method as in claim 18, wherein the etching comprises forming a photoresist pattern over the at least one dielectric, the photoresist pattern including void areas aligned over at least some of the metal features, and photoresist areas in other regions, then plasma etching.

20. A method for forming a semiconductor image sensor, comprising:
   providing a metal pattern including metal features over a substrate;
   depositing at least one optically transparent first dielectric layer over the metal features and over the substrate between the metal features;
   polishing the at least one first dielectric layer to expose top surfaces of the metal features;
   polishing the metal features using a chemical mechanical polishing process that polishes the metal features faster than the at least one first dielectric layer to form top surfaces of the metal features below a top surface of the at least one dielectric and to further eliminate any inclined remaining dielectric layer; and
   forming a second dielectric layer over the metal features and the first dielectric layer therebetween, such that there is substantially the same first total dielectric thickness over the metal features and substantially the same second total dielectric thickness over the substrate in areas between the metal features.

* * * * *